United States Patent [19]

Bhat et al.

[11] Patent Number: 5,065,200
[45] Date of Patent: Nov. 12, 1991

[54] GEOMETRY DEPENDENT DOPING AND ELECTRONIC DEVICES PRODUCED THEREBY

[75] Inventors: Rajaram Bhat, Red Bank; Chung-en Zah, Marlboro, both of N.J.

[73] Assignee: Bell Communications Research, Inc., Livingston, N.J.

[21] Appl. No.: 454,764

[22] Filed: Dec. 21, 1989

[51] Int. Cl.$^5$ .............................................. H01L 27/12
[52] U.S. Cl. ........................................... 357/4; 357/16; 357/17; 357/35; 357/60; 372/46; 372/47
[58] Field of Search ...................... 357/45 L, 17, 17 L, 357/16, 34, 35, 60; 372/46, 47, 48, 45

[56] References Cited

U.S. PATENT DOCUMENTS

| 4,775,882 | 10/1988 | Miller et al. | 357/34 |
| 4,785,457 | 11/1988 | Asbeck et al. | 372/46 |
| 4,805,179 | 2/1989 | Harder et al. | 372/46 |
| 4,839,307 | 6/1989 | Imanaka et al. | 357/17 |
| 4,932,033 | 6/1990 | Miyazawa et al. | 372/46 |

FOREIGN PATENT DOCUMENTS 0259026  3/1988  European Pat. Off. .............. 372/47

OTHER PUBLICATIONS

Kapon et al., "Lateral Patterning of Semiconductor Superlattice Heterostructures by Epitaxial Growth on Nonplanar Substrates", *Proceedings of SPIE*, Mar. 1988, vol. 944, pp. 80–91.
Jaeckel et al., "High-Power Fundamental Mode Al-GaAS Quantum Well Channeled Substrate Laser Growth by Molecular Beam Epitaxy", *Applied Physics Letters*, Sep. 1989, vol. 55, pp. 1059–1061.
Kamon et al., "Orientation Dependence of GaAs Growth in Low-Pressure OMVPE", *Journal of Crystal Growth*, 1984, vol. 84, pp. 126–132.
Wang et al., "Crystal Orientation Dependence of Silicon Doping in Molecular Beam Epitaxial AlGaAs/GaAs Heterostructures", *Applied Physics Letters*, Oct. 1985, pp. 826–828.
T. F. Kuech and E. Veuhoff, "Mechanism of Carbon Incorporation in MOCVD GaAs", *Journal of Crystal Growth*, 1984, vol. 68, pp. 148–156.

*Primary Examiner*—Andrew J. James
*Assistant Examiner*—Courtney A. Bowers
*Attorney, Agent, or Firm*—Leonard Charles Suchyta; Charles S. Guenzer

[57] ABSTRACT

The method and product of laterally defining semiconductor structures using geometry depending doping. A compound semiconductor substrate, for example, InP or GaAs, is formed with a groove in a predetermined direction. One or more epitaxial layers are deposited on both the grooved portion and the planar portions of the substrate and include both n-type and p-type dopants. The incorporation rates of the dopants into the deposited layers depend upon the crystalline orientation of the planar surface or the sidewalls of the groove. Thereby, the planar portion may be formed of one conductivity type and the groove with the other. The invention is particularly useful for defining the current structure in a semiconductor laser.

11 Claims, 3 Drawing Sheets

5,065,200

GEOMETRY DEPENDENT DOPING AND ELECTRONIC DEVICES PRODUCED THEREBY

FIELD OF THE INVENTION

The invention relates generally to patterning of semiconductor devices. In particular, the invention relates to a method and the product thereof of providing lateral definition for current confinement or isolation in after-grown semiconductor layers.

BACKGROUND OF THE INVENTION

All but the simplest electronic or opto-electronic components require some lateral definition of one or more semiconductor or insulating layers. Similarly, electronic or optoelectronic integrated circuits involve a number of separate electronic or optical components on the same chip which need to be laterally defined on the chip so as to form separate components. The usual method for patterning lateral features in a semiconductor wafer is photolithography. There are many variations of the photolithographic process but, with few exceptions, a lateral feature in the finished device needs to be defined in the photoresist during the photographic step. A separate etching step then transfers the feature from the photoresist into an already grown layer.

An electronic integrated circuit and particularly an opto-electronic integrated circuit require large numbers of layers. One standard measure of circuit complexity is the number of photographic masks or mask levels required to fabricate the circuit in a repetitive sequence of photolithographic steps. Each mask level usually requires a sequence of spinning on photoresist, photographic exposure, development of the photoresist to form a mask, etching the substrate through the mask, and removing the mask. Each mask level thus causes added expense in the fabrication process and additional equipment in a production environment.

A further problem arises with photolithographic definition of opto-electronic devices, for instance lasers. Typically for single-mode optical elements including lasers, the active lasing medium is photolithographically defined to have a lateral dimension close to the optical wavelength. Perhaps thereafter cladding material is grown adjacent the defined lasing medium although sometimes air/vacuum is used as the cladding. Nonetheless, there is an interface bordering the active medium which was exposed to ambient after the etching. Such an interface is likely to have a large number of electronic surface states which degrade the operation of the laser.

One novel approach in achieving lateral patterning has been disclosed by Kapon et al in a technical article entitled "Lateral patterning of semiconductor superlattice heterostructures by epitaxial growth on nonplanar substrates" appearing in Proceedings of SPIE, volume 944, 1988 at pages 80-91. This technique relies on the different growth rates on different crystal planes. They pattern a groove in a crystal substrate and thereafter grow multiple layers both in the groove and over the surrounding planar area. Because of the differential growth rates, layer thicknesses change in the vicinity of the groove. For very thin layers, quantum well effects cause the band gaps to be dependent on layer thicknesses. Thereby, lateral bandgap variations appear over the groove cross-section, which can be used for lateral light confinement. However, this effect requires very small dimensions associated with quantum wells. Furthermore, since the lateral current confinement is very poor, it requires extra steps, such as proton bombardment, to create the necessary confinement. The alignment becomes critical in such processing.

Jaeckel et al have recently disclosed in a technical article entitled "High-power fundamental mode AlGaAs quantum well channeled substrate laser grown by molecular beam epitaxy" appearing in Applied Physics Letters, volume 55, 1989 at pages 1059-1061 a method of growing a laser in a groove. A flat-bottomed groove is formed in a (100) substrate of GaAs and thereafter a graded-index separate confinement heterostructure laser is grown primarily of AlGaAs but with a GaAs quantum well active layer. The lower AlGaAs cladding layer is uniformly doped p-type. However, the upper AlGaAs cladding layer is doped with Si, which is amphoteric so as to produce n-type doping on the {100} plane exposed outside the groove and at the bottom of the groove and produce p-type doping on the {311} A planes exposed on the side of the grooves. Thereby, there is lateral current confinement in the upper cladding layer. This technique is of limited use however. It requires a unique combination of a dopant and substrate orientation. Furthermore, the p-type doping in the upper cladding layer extends only to the sides of the groove. Thereafter, this layer is again n-type. Therefore, the upper current electrode must be defined to within the width of the groove.

SUMMARY OF THE INVENTION

Accordingly, an object of the invention is to provide electronic devices for which the number of mask levels used in their fabrication is reduced.

It is another object of this invention to provide such electronic devices in which lateral interfaces can be formed without the use of photolithography.

It is still further object of this invention to provide such opto-electronic devices.

The method can be summarized as a method of growing laterally patterned structures in which a compound semiconductor substrate is formed with a groove having such an orientation that the doping concentration of subsequently formed epitaxial layers depends on the local crystalline orientation of the grooved substrate. Thereafter, an epitaxial structure is grown. In one embodiment, the structure includes at least one superlattice portion having alternating layers of a higher concentration of a first semiconductivity type and a lower concentration of a second semiconductivity type. Depending on the orientations and substrates, the superlattice doping is maintained over one area of the grooved substrate but diffuses to form a uniform first or second semiconductivity type over another area, the semiconductivity type being dependent upon orientations, layer thicknesses and dopant concentrations. The junctions of the maintained superlattice can block current that flows through the uniform conductivity region. In another embodiment, the epitaxial growth proceeds with both n-type and p-type dopants. However, dependent on the local crystalline orientation, the single growth produces n-type material in one area and p-type material in another.

DETAILED DESCRIPTION

Figure 1:
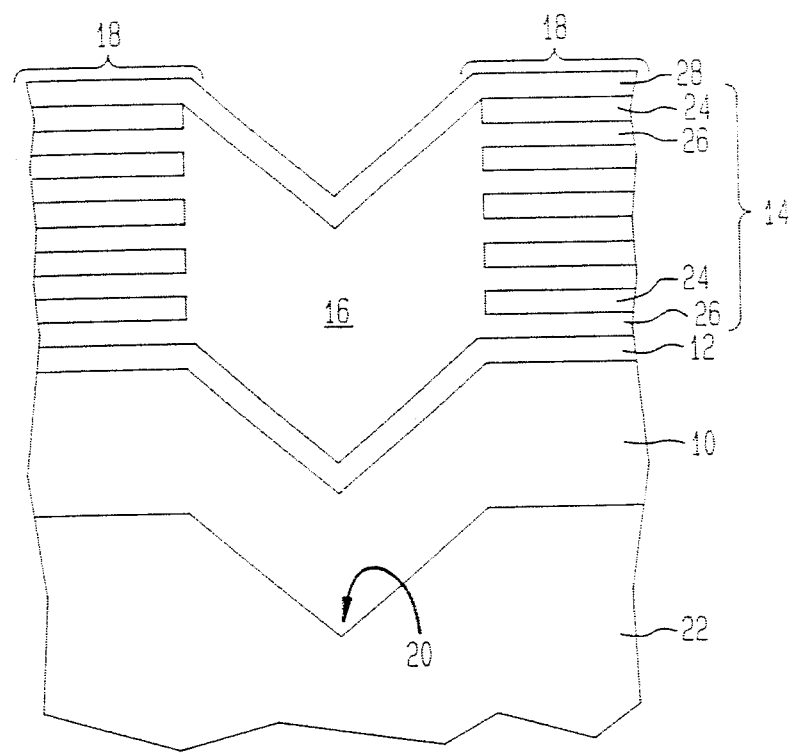
FIG. 1 is a cross-section of a double heterostructure laser according to the invention and utilizing a superlattice current isolation region.

A first embodiment of the invention, which is a double heterostructure laser, is illustrated in cross-section in FIG. 1. There are sequentially formed a lower cladding layer 10 and an active region 12. Thereafter, a superlattice structure 14 is grown which is divided naturally into an upper cladding region 16 and a surrounding current confining region 18. Except for a preprocessing step of photolithographically defining a groove 20 in a substrate 22, no lateral definition is required. Nonetheless, current is confined in the upper cladding region 16 overlying the groove 20 because of geometry dependent doping within the groove 20. This embodiment was experimentally verified as follows.

The substrate 22 was InP having a principal surface oriented in the [100] direction to within $\pm 0.5°$. The substrate 22 was doped with S in order to be n+ and act as a current electrode for the laser. The groove 20 was photolithographically formed along the [01$\bar{1}$] direction using an SiO$_2$ mask having an aperture of 1.5 $\mu$m and then etching for 1 minute in H$_3$PO$_4$:HCl (3:1, by volume) to produce a V-shaped groove 20. Shorter etching times would have produced a flat-bottomed groove. It was observed that grooves oriented along the [01$\bar{1}$] direction had side walls close to the {211} A crystal planes. After etching, the SiO$_2$ mask was removed with buffered HF. The grooved substrate 22 was degreased and etched in H$_2$SO$_4$:H$_2$O$_2$:H$_2$O (5:1:1, by volume) at room temperature prior to epitaxial growth. This last etch did not remove any measurable quantity of material and thus did not affect the shape of the groove 20.

The cleaned substrate 22 was then loaded into a horizontal OMCVD (organo-metallic chemical vapor deposition) chamber operating at 76 torr. The substrate was heated to the OMCVD growth temperature of 625° in ~2 minutes in an atmosphere consisting of hydrogen and phosphine ($2 \times 10^{-2}$ mole fraction). The lower cladding layer 10 of InP was grown to a thickness of 1 $\mu$m and doped n to $1 \times 10^{18}$ cm$^{-3}$. The InP was grown from trimethylindium and phosphine and the n-type doping from S was produced by using hydrogen sulfide. In later steps, any p-type doping from Zn was produced by using diethylzinc. All doping concentrations and layer thicknesses were calibrated based on separate depositions upon planar (100) surfaces of InP and calibrating measurements on these planar layers.

The active layer 12 was epitaxially grown over the lower cladding layer 10 by OMCVD in order to serve as the active laser region. The active layer 12 was 0.2 $\mu$m thick and was nominally undoped. It had a quaternary composition of InGaAsP that was lattice matched to InP on a (100) surface and had a photoluminescence peak wavelength at room temperature of 1.3 $\mu$m.

Thereafter, the superlattice region 14 was grown by OMCVD in the form of alternating layers of n-type and p-type InP. The superlattice, as grown, consisted of 20 periods of an n-type InP layer 24 doped n=$1 \times 10^{18}$cm$^{-3}$ and a p-type InP layer 26 doped p=$7 \times 10^{17}$cm$^{-3}$. Both the n-type and p-type InP superlattice layers 24 and 26 had thicknesses of 55 nm. Finally, there was grown a p+ contact layer 28 of InGaAsP to a thickness of 0.2 $\mu$m and having a concentration of p=$1 \times 10^{18}$cm$^{-3}$. The contact layer 28 was subjected to a shallow Zn diffusion to guarantee low contact resistance for the second and upper electrode of the laser. The p-contact was made through a 5 $\mu$m wide opening in a SiO$_2$ mask centered over the groove 20.

Figure 2:
FIG. 2 is an electron micrograph of the laser of FIG. 1 taken on the same cross-section.
Figure 2:
Figure 2:
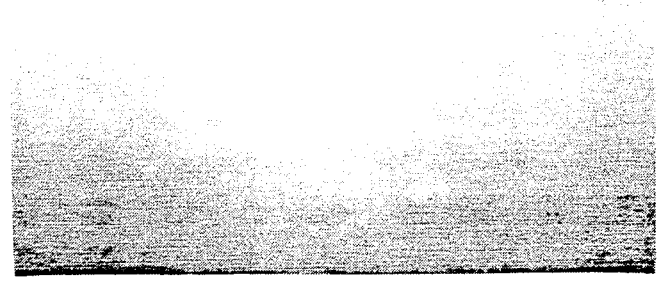

Although the n-type and p-type superlattice layers 24 and 26 were deposited continuously across the groove 20, the upper cladding region 16 above the groove 20 was uniformly p-type. FIG. 2 shows an SEM (scanning electron micrograph) cross-section of a structure very similar to that of FIG. 1 in which the cross-section was stained under illumination with 12 g of KOH, 9 g of KFe(CN)$_6$ and 75 cc of water so as to delineate the n-type layers from the p-type layers. It is clear that a uniform p-type region has been from the superlattice in the grooved area overlying the groove 20 but that the superlattice remains intact in the planar areas of the substrate away from the groove 20.

Several mechanisms appear to be responsible. In a separate experiment, S-doped layers and Zn-doped layers were grown on both a (100) InP substrate and a (111)A InP substrate. For doping levels of n=$1.8 \times 10^{18}$cm$^{-3}$ and p=$7 \times 10^{17}$cm$^{-3}$ on (100) substrates, the corresponding doping levels under identical growth conditions for (111)A substrates were n=$1.8 \times 10^{17}$cm$^{-3}$ and p=$4 \times 10^{18}$cm$^{-3}$. That is, the Zn incorporation is higher for (111)A substrates than for (100) substrates while the relative S incorporation rates are reversed. The layers are thin enough to expect significant diffusion of dopants from the neighboring layers. In particular, it is believed that the enhanced p-type dopant Zn in the p-type layers 26 on the sidewalls of the groove 20 vertically diffuses and overcompensates the depressed n-type doping of the n-type layers 24.

Similar differential doping measurements were performed for S and Zn on different planes of GaAs. The GaAs results very closely follow those for InP. Therefore, similar devices are achievable in InP and GaAs and other III-VI compounds of the zinc-blende crystal structure, all referred to as semiconductor compounds.

In the structure of the SEM micrograph, during OMCVD growth of the lower cladding layer 10, the original {211}A sidewalls in the groove 20 are replaced by planes close to {311}A and {111}A. It further shows that the quaternary layer 12 grows in the form of a cresent at the bottom of the then existing groove.

Whatever the mechanism, the upper cladding region 16 above the groove 20 is uniformly p-type while in the planar portions 18 the superlattice maintains its structure of multiple p-n junctions. Such p-n junctions present resistance to current flow and thus confine the current to the upper cladding region 16 overlying the groove 20. Thus, the lateral definition of either the contact layer 28 or its Zn diffusion is subject to very relaxed dimensional requirements. Further, the interface between the upper cladding region 16 and the current confining structure 18 is an epitaxial interface which should provide reduced number of surface states.

The sample formed with the structure of FIG. 1 was cleaved into a cavity having a length of 254 $\mu$m. At 20° C., the laser had a pulsed threshold current of around 100 mA. For CW operation, the threshold current increases to 120 mA but the efficiency was 0.170 mW/mA, comparable to that of a conventional buried heterostructure laser.

In the superlattice growth procedure described above, there is a maximum thickness of the n-type InP layer 24 that allows for complete conversion of that layer to p-type within the upper cladding region 16 above the groove 20. Even for a given set of growth conditions, the maximum thickness will depend on the relative n-type and p-type doping levels. Effective current blocking has been observed for InP superlattices 14 with complete conversion within the upper cladding region 16 for: (1) 100 nm thick layers of $n=1\times10^{18} cm^{-3}$ alternating with 100 nm thick layers of $p=7\times10^{17} cm^{-3}$; and (2) 140 nm thick layers of $p=3\times10^{17} cm^{-3}$ alternating with 85 nm thick layers of $n=5\times10^{17} cm^{-3}$.

Figure 3:
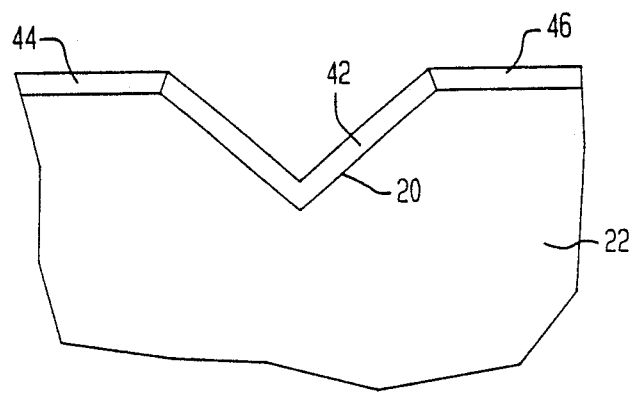
FIG. 3 is a cross-section of a lateral p-n structure built according to the invention.

A procedure similar to that used for the laser of FIG. 1 can be used to grow a lateral p-n junction. As illustrated in FIG. 3, the groove 20 is formed along the [01$\bar{1}$] direction in the (001) surface of the semiinsulating InP substrate 22. Thereafter, in a single growth a layer of InP is epitaxially grown by OMCVD above the substrate 22. The growth takes place with both p-type and n-type dopants (Zn and S) present in relative quantities such that an InP layer grown on a (001) surface is more n-type than p-type. There results a p-type InP layer 42 formed in the groove 20 and two n-type InP layers 44 and 46 formed on the {001} planes on the opposing sides of the groove 20. The three InP layers 42, 44 and 46 form two lateral p-n junctions or, alternatively, a lateral n-p-n transistor when respective contact layers are thereafter deposited on portions of the layers 42, 44 and 46. Multiple grooves easily provide an array of such junctions or transistors, which could be adapted to detector arrays, for example. Furthermore, if the groove 20 were oriented along the [011] direction, the positions of the n-type and p-type materials can be reversed from those of FIG. 3.

The laser embodiment of FIG. 1 demonstrates how a p/n superlattice is converted to a uniform p-type region in a [01$\bar{1}$] oriented groove. The co-doping procedure with a [011] groove described with reference to FIG. 3 can produce a uniform n-type region in that groove. The two effects can be combined to form a p/n superlattice with separate electrical connections to its p-type and n-type layers. A p/n superlattice is grown on a (100) surface on which had been previously formed two perpendicular grooves in the [01$\bar{1}$] and the [011] directions. All layers of the superlattice are co-doped with both n-type and p-type dopants. With the proper choice of thickness and doping levels, all the resulting p-type layers in the superlattice will be electrically connected to a uniform p-type conductor overlying the [01$\bar{1}$] groove (as in FIG. 1) while all the resulting n-type layers in the superlattice will be electrically connected to a uniform n-type conductor overlying the [011] groove. Typical doping levels, as measured on the (001) surface would be for the n-type layers of the superlattice $n=1\times10^{18} cm^{-3}$ and $p=1\times10^{17} cm^{-3}$ and for the p-type layers of the superlattice $n=1\times10^{17} cm^{-3}$ and $p=1\times10^{18} cm^{-3}$. Such a structure is useful for electrically contacting a superlattice modulator.

Figure 4:
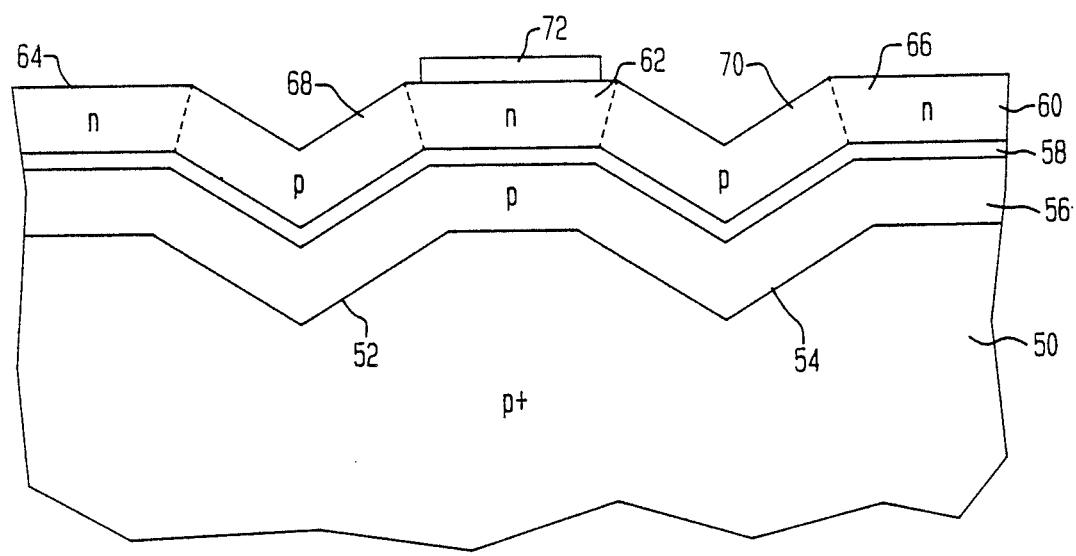
FIG. 4 is a cross-section of another heterostructure laser according to the invention in which the laser is formed on a planar area.

The structure of FIG. 3 can be used to form a semiconductor laser, illustrated in the cross-section of FIG. 4, with a vertical current path through a planar area and in which the current isolation is provided by two neighboring grooved areas. This structure is thus reversed from that of FIG. 1. A substrate 50 of p+-type InP has a principal (100) surface in which are formed two grooves 52 and 54 extending along the [01$\bar{1}$] direction. The p+ substrate 50 serves as the lower current electrode. A lower cladding layer 56 of p-type InP is epitaxially grown over both the grooves 52 and 54 and the planar areas. Thereafter an active layer 58 is epitaxilly grown with no further lateral definition. The active layer 58 may be a quaternary III-V compound, such as InGaAsP, or a multi-quantum well based on this same compound family.

Thereafter, an upper cladding layer 60 of InP is epitaxially deposited with both S and Zn being simultaneously supplied as n-type and p-type dopants respectively. The S and Zn are supplied in relative amounts during the growth of the upper cladding layer 60 such that the growth on a (100) surface is n-type but that the growth on the sidewalls of the grooves 52 and 54 is p-type. Because of the orientation dependence of the S and Zn dopant incorporation rates, a central planar mesa region 62 between the grooves 52 and 54 and two outer planar regions 64 and 66 become n-type while two grooved regions 68 and 70 are grown p-type. Such relative doping levels have been achieved with OMCVD using dopant growth parameters which separately would achieve $n=1\times10^{18} cm^{-3}$ from S and $p=1\times10^{17} cm^{-3}$ from Zn on a InP (100) surface.

Finally, an n-contact layer 72 is deposited and defined over the mesa region 62 to serve as the upper current electrode. Because of the current confinement provided by the p-type grooved regions 68 and 70 for GaAs/AlGaAs lasers, the lateral registry of the n-contact layer 72 and the mesa region 62 is not crucial. However, in InP-based lasers, such confinement is not strong enough so such registry is then crucial.

Current is injected into the laser by the n-contact layer 72 and is guided through the n-type mesa region 62 beneath the n-contact layer 72 by the surrounding p-type grooved regions 68 and 70. The laser light is generated in the vicinity of the active layer 58 and is guided out of the plane of the illustration by the upper and lower cladding layers 60 and 56. An advantage of the structure of FIG. 4 over that of FIG. 1 is that the laser is formed on a planar portion of the substrate rather than at the bottom of a groove. Thus, it is much easier to perform the quantum well growth and to etch gratings on the planar portion than within the groove. Such etched gratings are required for DFB (distributed feedback) and DBR (distributed Bragg reflector) lasers.

Figure 5:
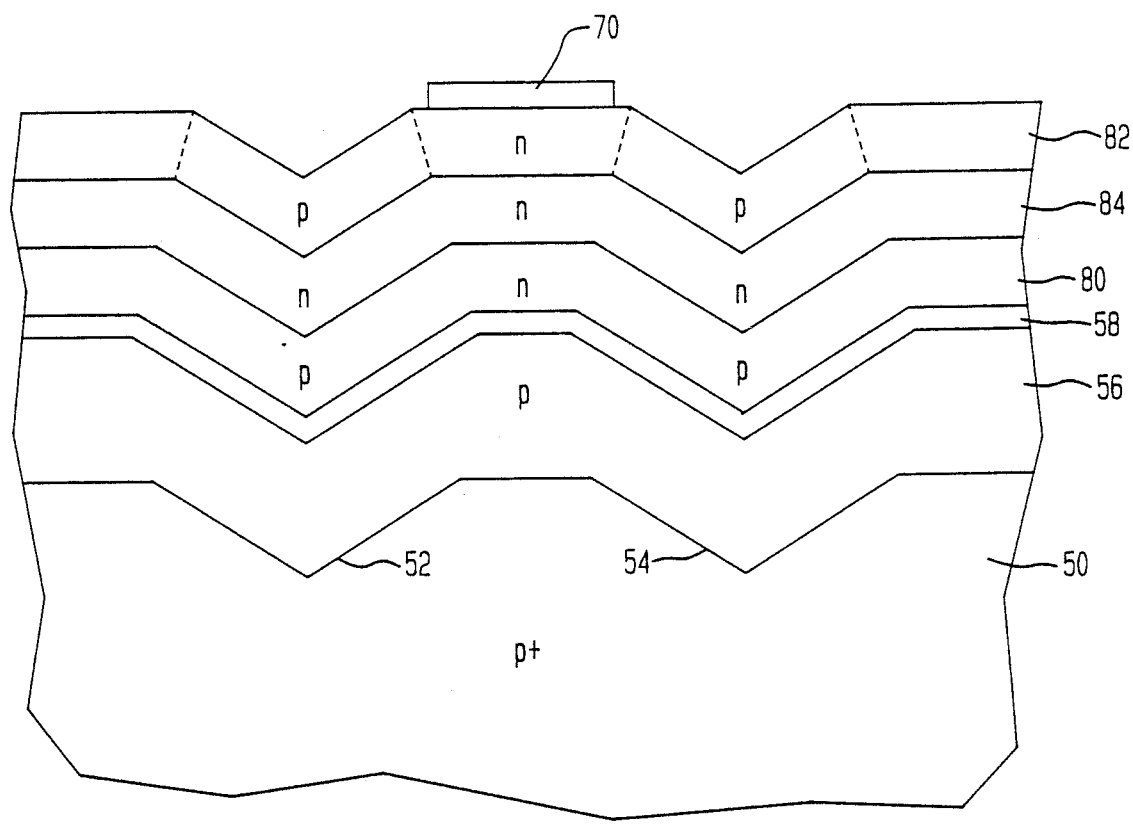
FIG. 5 is a cross-section of an improvement to the heterostructure laser of FIG. 4.

Current confinement could be further improved by inserting an n-type layer in the middle of the p-type grooved regions 68 and 70. As illustrated in cross-section in FIG. 5, the structure of the substrate 50, the lower cladding layer 56 and the active layer 58 is the same as that in FIG. 4. However, in place of the single upper cladding layer 60 there are formed thinner first and second upper cladding layers 80 and 82 of the same S and Zn doping as the single upper cladding layer 60 of FIG. 4. There is also formed between the first and second upper cladding layers 80 and 82 an n-type third upper cladding layer 84. This n-type layer 84 is grown with only S doping and is of sufficient thickness and dopant concentration to prevent the Zn from diffusing in areas of the grooves 52 and 54 and overcompensating the S.

Although several embodiments have been described, the invention is not limited thereto. The invention provides the possibility of building a heterojunction laser and other complex opto-electronic devices with a single series of growth steps uninterrupted by any photolithographic patterning. Thus, the cost of manufacturing these devices can be substantially reduced. Furthermore, since the lateral definition is achieved without etching or ion bombardment, surface states degrading the device performance are reduced.

What is claimed is:

1. A semiconductor structure, comprising:
    a substrate comprising a compound semiconductor and having formed in a principal surface of a first orientation a groove extending along a first direction, said groove having a sloping sidewall of a second orientation different from said first orientation, said principal surface having a planar area and a grooved area, said grooved area including at least a portion of said sidewall; and
    a p-n structure comprising a superlattice of a plurality of alternating semiconducting layers of a substantially uniform n-type conductivity and semiconducting layers of a substantially uniform p-type conductivity overlying a first one of said planar area and said grooved area, said superlattice including a semiconductor layer comprising a compound semiconductor epitaxially formed over said planar area and said grooved area, said semiconductor layer comprising a first area of said substantially uniform p-type conductivity overlying one of said planar area and said grooved area and a second area of said substantially uniform n-type conductivity overlying the other of said planar area and said grooved area, said first and second areas being contiguous and said semiconductor layer being epitaxial between said first and second areas.

2. A semiconductor structure as recited in claim 1, further comprising a lower cladding layer of a compound semiconductor having a substantially same conductivity type throughout and epitaxially formed on said substrate across said planar and grooved areas and an active layer of a quaternary semiconductor epitaxially formed on said lower cladding layer below said semiconductor layer.

3. A double heterojunction laser, comprising:
    a compound semiconductor substrate having two parallel grooves formed in a principal face of a first orientation and extending along a first direction, said parallel grooves being separated by a planar area of said substrate having said first orientation;
    a lower cladding layer comprising a compound semiconductor of a first conductivity type being epitaxially formed on said substrate over a first area including said grooves and said planar area and continuous therebetween;
    an active layer comprising a compound semiconductor being epitaxially formed over said lower cladding layer over said first area; and
    an upper cladding layer comprising a compound semiconductor and two different and coextensive dopant species epitaxially formed on said active layer over said first area, said upper cladding layer being of a second conductivity type in a portion overlying said planar area and being of said first conductivity type in portions overlying said grooves, wherein said two dopant species produce opposite conductivity types in said compound semiconductor, at least one of said two dopant species having a substantially different incorporation rate between different crystallographic orientations of said compound semiconductor.

4. A lateral compound semiconductor p-n junction structure, comprising:
    a substrate of a semiinsulating compound semiconductor having formed in a principal face thereof a groove extending in a first direction;
    a semiconductor layer comprising a compound semiconductor and two different and coextensive dopant species epitaxially formed over said substrate over a first area including said groove and over second and third areas including planar portions of said substrate on opposing lateral sides of said groove, said semiconductor layer being of a first conductivity type in a first portion overlying said first area and being of a second conductivity type in second and third portions overlying said second and third areas, wherein said two dopant species produce opposite conductivity types in said compound semiconductor, at least one of said two dopant species having a substantially different incorporation rate between different orientations of said compound semiconductor; and
    means for establishing a current path in said semiconductor layer passing from said second portion through said first portion to said third portion.

5. A semiconductor structure, comprising:
    a substrate comprising a compound semiconductor and having formed in a principal surface of a first orientation a groove extending along a first direction, said groove having a sloping sidewall of a second orientation different from said first orientation; and
    a semiconductor layer comprising a compound semiconductor epitaxially formed over a planar area and a grooved area of said principal surface, said grooved area including at least a portion of said sidewall, said semiconductor layer comprising a first area of a substantially uniform p-type conductivity overlying one of said planar area and said grooved area and a second area of a substantially uniform n-type conductivity overlying the other of said planar area and said grooved area, said first and second areas being contiguous and said semiconductor layer being epitaxial between said first and second areas; wherein said semiconductor layer comprises two different and coextensive dopant species producing opposite conductivity types in said compound semiconductor, at least one of said two dopant species having a substantially different incorporation rate between said first orientation and said second orientation of said compound semiconductor.

6. A semiconductor structure as recited in claim 1, wherein said p-n structure comprises a region of a substantially same conductivity type throughout and overlying a second one of said planar area and said grooved area laterally adjacent to said superlattice.

7. A semiconductor structure as recited in claim 2, wherein said same conductivity type is n-type.

8. A laser as recited in claim 3, wherein boundaries separating first conductivity type from second conductivity type portions of said upper cladding layer substantially overlie boundaries separating said planar area from said grooves.

9. A laser as recited in claim 4, wherein boundaries separating said first portion from said second and third portions of said semiconductor layer substantially overlie boundaries separating said groove from said planar portions.

10. A double heterojunction laser as recited in claim 3, wherein said first orientation is a [001] orientation and wherein said first direction, said first conductivity type, and said second conductivity type are interrelated according to one of a first relationship and a second relationship;

wherein according to said first relationship said first direction is [01$\bar{1}$], said first conductivity type is p type and said second conductivity type is n type; and wherein according to said second relationship said first direction is [011], said first conductivity type is n type, and said second conductivity type is p type.

11. A lateral compound semiconductor p-n junction structure as recited in claim 8, wherein said principal face has a [001] orientation and wherein said first direction, said first conductivity type, and said second conductivity type are interrelated according to one of a first relationship and a second relationship;

wherein according to said first relationship said first direction is [01$\bar{1}$], said first conductivity type is p type and said second conductivity type is n type; and wherein according to said second relationship said first direction is [011], said first conductivity type is n type, and said second conductivity type is p type.

* * * * *

UNITED STATES PATENT AND TRADEMARK OFFICE
CERTIFICATE OF CORRECTION

PATENT NO. : 5,065,200

DATED : November 12, 1991

INVENTOR(S) : Rajaram Bhat and Chung-en Zah

It is certified that error appears in the above-identified patent and that said Letters Patent is hereby corrected as shown below:

Column 4, line 44, "III-VI" should read --III-V and II-VI--.
Column 6, line 6, "epitaxilly" should read --epitaxially--.

Signed and Sealed this

Ninth Day of March, 1993

*Attest:*

STEPHEN G. KUNIN

*Attesting Officer*  *Acting Commissioner of Patents and Trademarks*